United States Patent [19]
Holst

[11] Patent Number: 5,940,334
[45] Date of Patent: Aug. 17, 1999

[54] MEMORY INTERFACE CIRCUIT INCLUDING BYPASS DATA FORWARDING WITH ESSENTIALLY NO DELAY

[75] Inventor: John Christian Holst, San Jose, Calif.

[73] Assignee: Advanced Micro Devices, Inc., Austin, Tex.

[21] Appl. No.: 08/938,718

[22] Filed: Sep. 26, 1997

Related U.S. Application Data

[60] Provisional application No. 60/027,329, Sep. 30, 1996.
[51] Int. Cl.$^6$ ....................................................... G11C 7/06
[52] U.S. Cl. ......................... 365/190; 365/196; 365/202; 365/189.01; 365/189.07; 365/205
[58] Field of Search ................................... 365/190, 196, 365/202, 189.01, 189.07, 205

[56] References Cited

U.S. PATENT DOCUMENTS

| | | |
|---|---|---|
| 4,069,475 | 1/1978 | Boettcher ................................. 365/205 |
| 4,388,705 | 6/1983 | Sheppard . |
| 5,563,826 | 10/1996 | Pascucci et al. . |
| 5,642,308 | 6/1997 | Yoshida . |

*Primary Examiner*—Viet Q. Nguyen
*Attorney, Agent, or Firm*—Skjerven, Morrill, MacPherson, Franklin & Friel, L.L.P.; Ken J. Koestner

[57] ABSTRACT

A circuit and operating technique acquires input write data available at the beginning of the first half cycle and passes the write data to read terminals, bypassing read data from a memory cell that is read during the first half cycle, while incurring no read access penalty. The circuit and operating technique bypass the input write data to the read terminal in place of data transferred from the memory cells. The data is forwarded to an node having a relatively large capacitance by connecting to the node very small devices with a small capacitance and with the small devices operating in saturation. The relatively large capacitance of the node is exploited to achieve a multiplexing functionality with effectively no delay.

16 Claims, 7 Drawing Sheets

5,940,334

MEMORY INTERFACE CIRCUIT INCLUDING BYPASS DATA FORWARDING WITH ESSENTIALLY NO DELAY

CROSS-REFERENCE TO RELATED APPLICATION

This application claims the benefit under 35 U.S.C. § 119(e) of U.S. Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

BACKGROUND OF THE INVENTION

1. Field of the Invention

The present invention relates to comparator circuits. More specifically, the invention relates to a self-timed differential comparator for applications such as performing a fast comparison of multiple address signals.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core. The execution speed of microprocessors is heavily analyzed and compared using standard benchmark tests for judging the performance of competing entries into the microprocessor market.

The performance of processors is determined not only on the operating clock speeds of the processors but also upon critical timing paths for handling data in the microprocessor. Data and instruction caches are microprocessor subsystems that are typically in the critical path determining processor performance. Performance depends on a cache controller quickly determining whether the instructions to be executed and the data to be operated upon are currently residing in the cache memory.

What are generally needed in microprocessors are circuits that reduce delays in critical timing paths. What are more specifically needed in microprocessors are memory interface circuits, including cache control circuits, that reduce timing delays in transferring data from memory to processor execution units.

SUMMARY

One example of a cache control circuit in a microprocessor includes a tag RAM and a translational lookaside buffer for holding data identifying instructions and data in the cache. The cache control circuit also includes a tag comparison circuit that compares the data in the tag RAM to data in the translational lookaside buffer for multiple tags in a single cycle and determines whether needed instructions or data reside in the cache. To increase the speed of operating in a critical timing path, the tag RAM performs a read operation in a first half cycle and a write operation in the second half cycle of a processor timing cycle. However, if the address of the write operation and the address of the read operation are the same, the data to read out in the first part of the cycle is not the data that is currently stored in the memory cells but is rather the data that would be stored in the second half of the cycle.

One technique for reading out the desired data involves reading the data from the tag RAM and the write data into a multiplexer with the multiplexer selecting from the data sources under control of a comparator which compares read address bits to write address bits. Unfortunately this technique introduces a multiplexer delay into the critical timing path for reading the tag to the output line.

What is needed is a technique for reading out the desired data that does not introduce a delay into critical timing paths.

A circuit and operating technique have been discovered that accept input write data available at the beginning of the first half cycle and passes the write data to read terminals, bypassing read data from a memory cell that is read during the first half cycle, while incurring no read access penalty. The circuit and operating technique bypass the input write data to the read terminal in place of data transferred from the memory cells.

It has been discovered that data is advantageously forwarded to a node having a relatively large capacitance by connecting to the node very small devices with a small capacitance and with the small devices operating in saturation. The relatively large capacitance of the node is exploited to achieve a multiplexing functionality with effectively no delay.

It has further been discovered that a bypass circuit forwards data to analog internal nodes of a sense amplifier and performs a multiplexing function with effectively no delay so that the speed of a normal data path is maintained.

In accordance with an embodiment of the present invention, a circuit includes a node connected to a high-capacitance driver for driving a terminal, a high capacitance read select switch connecting a volatile storage element to the node, and a low capacitance bypass switch connecting a write data source to the node. The write data is passed to the node and driven to the terminal bypassing the read data from the storage element while incurring no read access timing penalty.

In accordance with a further embodiment of the present invention, a method of operating a circuit includes timing a cycle including a first half cycle and a second half cycle, acquiring input write data at the beginning of the first half cycle, reading data from a memory element during the first half cycle, and passing the write data to a read terminal, bypassing the read data while incurring no read access penalty.

In accordance with an additional embodiment of the present invention, a circuit includes a node having a relatively large capacitance, a first switch having a relatively large capacitance connecting the node to a first data source, and a second switch having a relatively small capacitance and operating in saturation connecting the node to a second data source, the data from the second data source bypassing the data from the first data source.

Many advantages are achieved by the described memory circuit and operating method. It is advantageous that a delay is avoided in a timing path that is typically a critical timing path of a microprocessor, allowing for faster operation of the microprocessor.

BRIEF DESCRIPTION OF THE DRAWINGS

The features of the described embodiments believed to be novel are specifically set forth in the appended claims.

However, embodiments of the invention relating to both structure and method of operation, may best be understood by referring to the following description and accompanying drawings.

DETAILED DESCRIPTION OF THE ILLUSTRATIVE EMBODIMENTS

Figure 1:
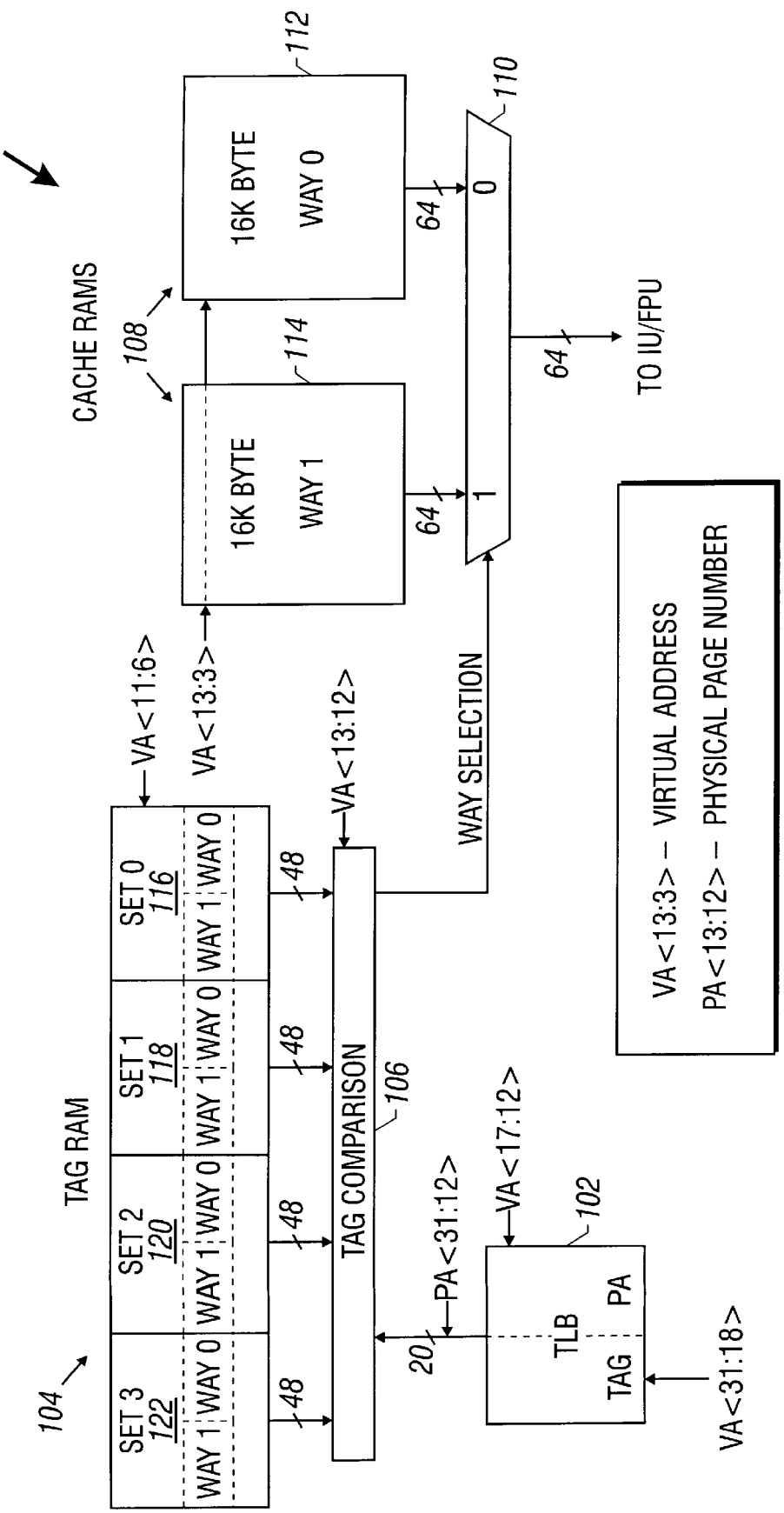
FIG. 1 is a schematic block diagram showing an embodiment of a cache and translation lookaside buffer (TLB) that is suitable for usage in the cache block shown in FIG. 5 hereinafter.

Referring to FIG. 1, a schematic block diagram illustrates an embodiment of a control circuit 100 portion of the cache block 502 (shown in FIG. 5) for implementing cache control using a translational lookaside buffer (TLB) 102. The cache control circuit 100 includes a tag RAM 104, the TLB 102, a tag comparison circuit 106, a cache RAM 108, and a multiplexer 110. A tag RAM 104, for example the instruction tag RAM, contains 512 20-bit physical tags. Each tag has two additional bits for status, and each pair of tags share a most-recently-used (MRU) bit. The tag RAM 104 is logically a two-way set-associative memory. The tag comparison circuit 106 has eight sets of tag-TLB comparators (not shown) and eight sets of snoop comparators (not shown). Eight tags are read in each cycle and compared to data from the TLB 102 so that all possible synonyms are checked in a single cycle, optimizing the speed of the cache block 502 at the expense of additional layout complexity and area. The tag RAM 104 performs a read operation in a first half cycle and a write operation in a second half cycle of a processor cycle. Write data is available at the beginning of the first half cycle and is bypassed to read terminals with no read access penalty. The tag RAM 104 includes circuits (not shown) implementing self-resetting circuit techniques and achieves a simulated access time of 1.7 ns (excluding operation of the comparators) driving a load of 1 pf.

The cache RAM 108 includes two ways, way 0 112 and way 1 114. The cache RAM 108 and the TLB 102 each have 256 sets. Each of the 256 sets contains two ways (or lines) and each line contains two sub-blocks so that the total number of bytes is 256×2×64 or 32 KB. Both the L1 instruction cache 402 and the data cache 440 (shown in FIG. 4) are 32 KB, virtually-indexed, two-way set-associative caches with a 64 byte-line size and 32 byte sub-blocking. Cache fills are performed on a sub-block basis.

Both the L1 instruction cache 402 and the data cache 440 are virtually indexed with only bits [13:12] of the index address being virtual. Bits [13:6] of the address define the set index of the address. Accordingly, each line resides in one set of a group of four sets with the groups being defined by the different combinations of bits [13:12]. The tag RAM 104 in both the L1 instruction cache 402 and the data cache 440 include special modifications for supporting reading of the group of four sets in one cycle. The tag RAM 104 is separated into four sets including set 0 116, set 1 118, set 2 120, and set 3 122. Each of the four sets in the tag RAM 104 include two ways, a way 0 and a way 1. The tag RAM 104 is effectively indexed by address bits [11:6] for read operations and a total of eight tags are read on every access of the tag RAM 104. The tag comparison circuit 106 compares all eight tags to a 20-bit physical address signal on physical address lines pa<31:12>from the TLB 102 to detect virtual index aliasing during tag lookup. When the tag comparison circuit 106 detects an alias, the cache line or sub-block is invalidated or, if dirty, written-back to memory. Then the cache line or sub-block at the address is returned to the cache block 502 and entered into a new set corresponding to the new linear index. In this manner, the TLB 102 disallows creation of aliases by ensuring that a line or sub-block resides in only one of the possible group of four sets.

In the L1 instruction cache 402, aliases are handled during cache line fills without penalty. The occurrence of an alias merely results in the invalidation of the appropriate cache line. In the L1 data cache 440, aliases for both read operations and write operations are handled by performing a state sequence that prevents disturbance from internal or external snoops while the lines are in process of eviction from the cache into a 4×64-bit write eviction buffer or write-back buffer (not shown). If an aliased line is dirty, the L1 instruction cache 402 performs a write back operation after the eviction into the write-back buffer. Once the alias is eliminated, the line is returned to the cache and deposited into a new set at a location corresponding to the new linear index.

Figure 2:
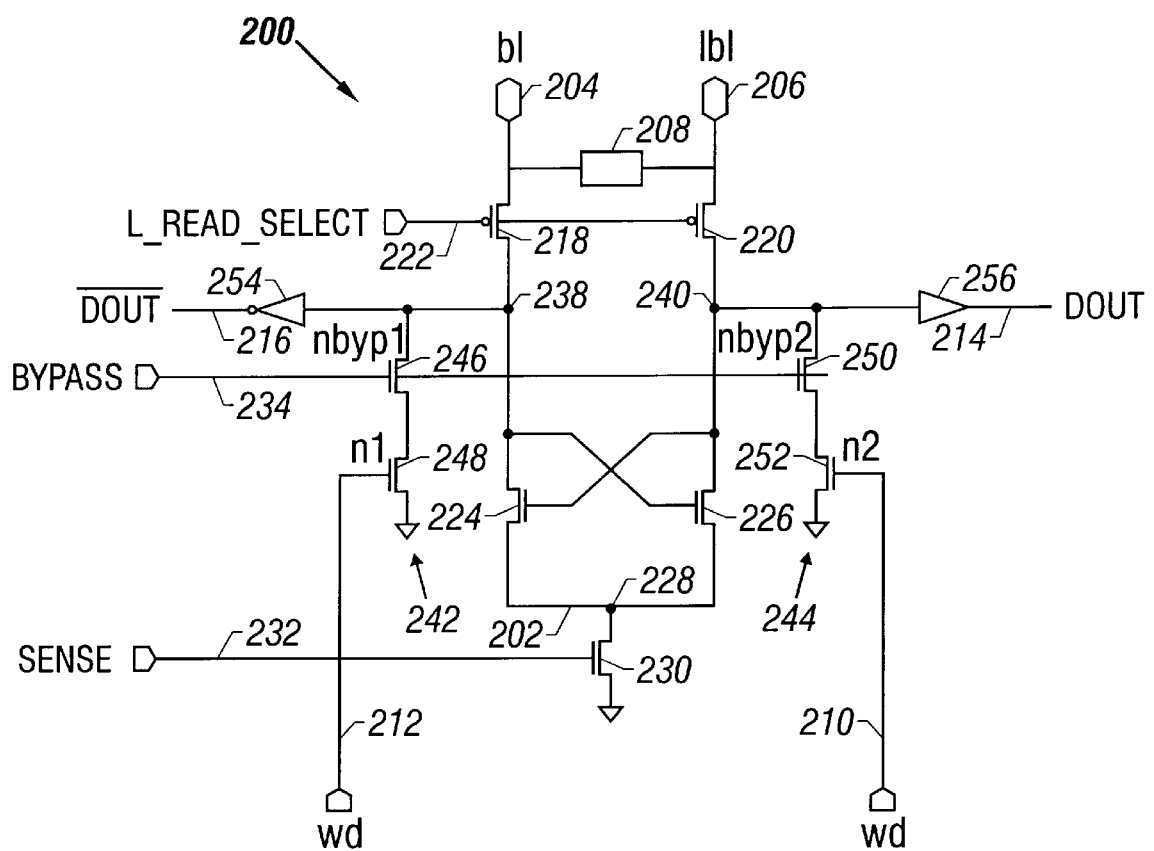
FIG. 2 is a schematic circuit diagram which illustrates a Tag RAM Bypass circuit.

Referring to FIG. 2, a schematic circuit diagram illustrates a Tag RAM Bypass circuit 200. The-illustrative Tag RAM Bypass circuit 200 is a portion of the tag RAM 104 shown in FIG. 1. The Tag RAM Bypass circuit 200 includes a sense amplifier 202 connected to the paired bit lines, bit line 204 and bit line bar 206. A memory cell 208 of the tag RAM 104 is connected between the bit line 204 and bit line bar 206. The memory cell 208 is a single-port memory cell. The sense amplifier 202 reads the memory cell 208 when the memory cell 208 is selected by read select line 222, unless write data is selected to be bypassed to output lines data out 214 and data out bar 216. The sense amplifier 202 is connected to the bit line 204 and bit line bar 206 by a pair of access or column-select transistors 218, and 220, respectively. The access transistors 218 and 220 are switches that are controlled by a read select line 222. In the illustrative embodiment, the access transistors 218 and 220 are p-channel MOSFETs. The access transistors 218 and 220 are connected to the sense amplifier 202 at respective nodes 238 and 240. The node 238 is connected to a data output bar driver 254 which drives the output line data out bar 216. The node 240 is connected to a data output driver 256 which drives the output line data out 214.

The Tag RAM Bypass circuit 200 depicts a portion of an extended circuit in the tag RAM 104 in which a multiplexer is formed including a plurality of read select lines 222 connected to a plurality of access transistors 218 and 220. The plurality of access transistors 218 and 220 multiplex one of n different bit line pairs onto the sense amplifier 202.

The sense amplifier 202 includes a pair of cross-coupled n-channel MOSFETs 224 and 226, for example a pair of n-channel MOSFETs having respective source-drain pathways between a mutual common node 228 and the bit line 204 and bit line bar 206. The gate terminal of the n-channel MOSFET 224 is connected to the node 240. The gate terminal of the n-channel MOSFET 226 is connected to the node 238. The common node 228 is connected to a reference such as VSS or ground via an n-channel MOSFET 230 having a gate connected to a sense line 232. The sense amplifier 202 amplifies a signal from the memory cell 208. The amplified signal is sent to the data out 214 and data out bar 216 lines.

The Tag RAM Bypass circuit 200 is controlled by a bypass signal on a bypass line 234 and write data lines 210 and 212 by means of transistor stacks 242 and 244. The transistor stack 242 includes a bypass transistor 1 246 serving as a switch controlled by the bypass signal and an n1 transistor 248 serving as a switch controlled by the write data bar line 212. The bypass transistor 1 246 and the n1 transistor 248 are connected in series with a source-drain pathway connected between the node 238 and the ground (VSS) reference. The transistor stack 244 includes a bypass transistor 2 250 serving as a switch controlled by the bypass signal and an n2 transistor 252 serving as a switch controlled by the write data line 210. The bypass transistor 2 250 and the n2 transistor 252 are connected in series with a source-drain pathway connected between the node 240 and the ground (VSS) reference. The bypass transistor 1 246 and bypass transistor 2 250 have gate terminals connected to the bypass line 234. The n1 transistor 248 has a gate terminal connected to the write data line bar 212. The n2 transistor 252 has a gate terminal connected to the write data line 210.

A suitable voltage across the bit line pairs, bit line 204 and bit line bar 206, is a small percentage of the power supply voltage VDD, for example 5 to 10% of VDD. In an illustrative embodiment a suitable voltage across the bit line pairs is 150 mV. Some voltage is lost passing through the resistance of the access transistors 218 and 220 so that the potential difference inside the sense amplifier 202 from the node 238 to the node 240 is slightly less than 150 mV. The access transistors 218 and 220 have a size, for example 10 microns in width, that contributes a suitable capacitance to the internal nodes 238 and 240 of the sense amplifier 202. The size of the access transistors 218 and 220, and therefore the capacitance, is selected since the drain to source voltage of the access transistor 218 and the access transistor 220 is small, only discharging one of the bit lines 204 or 206 by about 150 mV, so that the access transistors 218 and 220 essentially cannot go into saturation. The access transistors 218 and 220 operate in the linear region of conductivity and operate substantially as resistors. Other devices, including the data output driver 256 and the data output bar driver 254 which are illustratively 6/2 (8) micron devices, and the cross-coupled MOSFETs 224 and 226 which are illustratively 5 micron devices, add capacitance to the true and complement nodes 240 and 238 of the sense amplifier 202. In contrast, the transistor stacks 242 and 244 include small sized n-channel MOSFETs, the n1 transistor 248, the bypass transistor 1 246, the n2 transistor 252, and the bypass transistor 2 250, for example each having a width of 0.7 microns. The 0.7 micron n-channel MOSFET devices have a drain terminal that adds very little capacitance to the internal true and complement nodes 240 and 238 of the sense amplifier 202, particularly in comparison to the 10 micron access transistors 218 and 220.

The Tag RAM Bypass circuit 200 advantageously bypasses the write data which is available at the beginning of a first half cycle to read terminals without incurring a read access penalty. Conventional cache memories typically use a multiplexer stage following a sense amplifier to select between sensed data and bypass data. In the Tag RAM Bypass circuit 200, write data that is to be bypassed to the read terminal is applied directly to a sense amplifier 202, advantageously avoiding an additional delay that is incurred in the conventional cache memory through the usage of a follow-on multiplexer.

Figure 3:
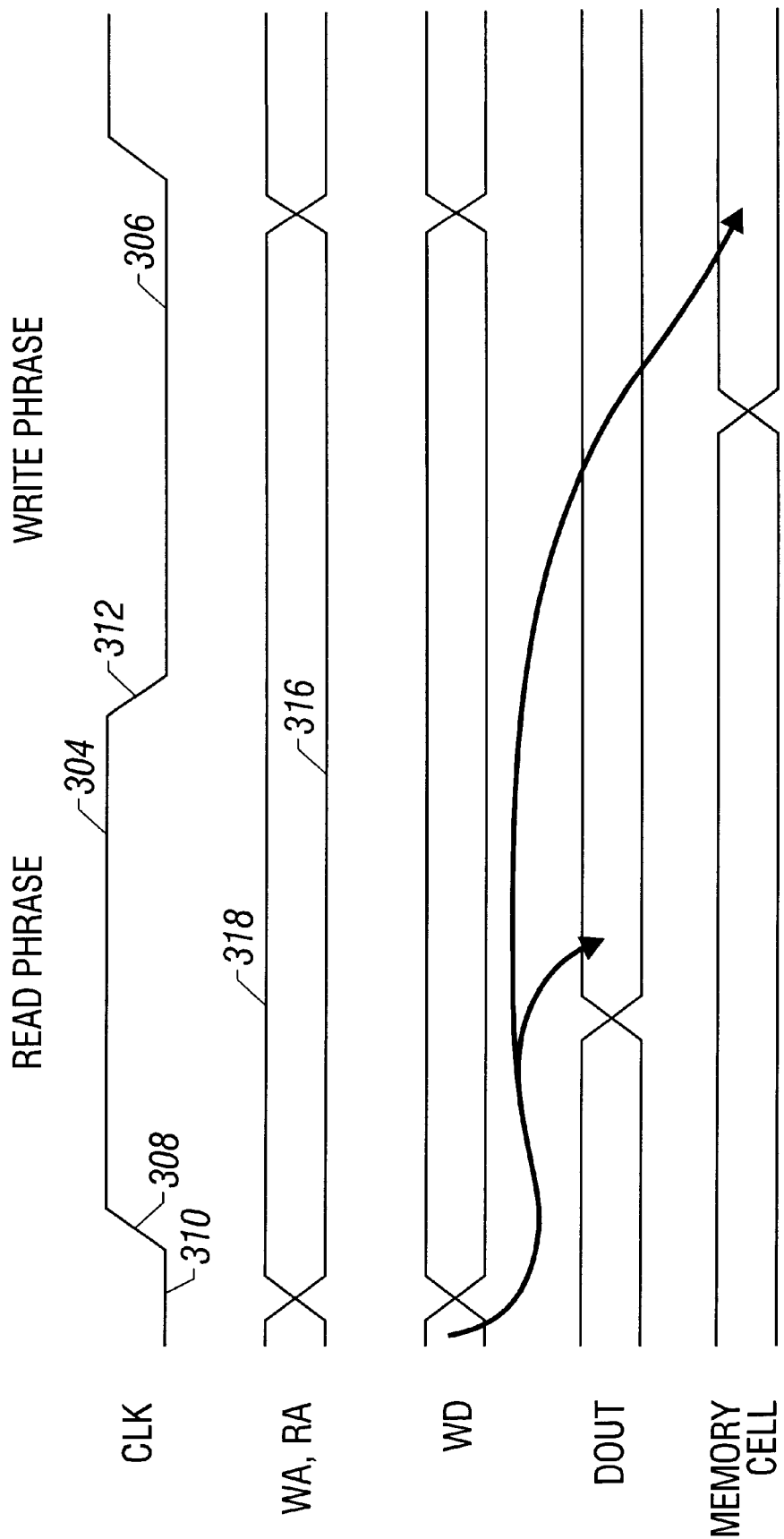
FIG. 3 is a schematic timing diagram showing an example of the operation of the Tag RAM Bypass circuit.

Referring to FIG. 3 in conjunction with FIG. 2, a schematic timing diagram illustrates an example of the operation of the Tag RAM Bypass circuit 200. The memory cell 208 is a single-port memory cell so that the Tag RAM Bypass circuit 200 performs both a read operation and a write operation sequentially in the same processor cycle. Write data 302 is present on the write data line 210 at the beginning of a processor clock cycle, prior to the read phase 304 of a next cycle. A read operation is initiated by the rising edge 308 of the clock signal 310. The write operation is initiated by the falling edge 312 of the clock signal 310 because the tag RAM 104 is internally pipelined. The operation of the tag RAM 104 is termed "time-multiplexed" operation. The write data 302 is bypassed onto a output line data out 214 and then written into a memory cell during the write phase 306. With the read operation taking place in the first part of the cycle and the write operation during the second part of the cycle, a problem arises when the write address (wa) 316 and the read address (ra) 318 are the same so that the data that is to be read out in the first part of the cycle is not the data that is currently stored in the memory cell 208 but is rather the data that would be stored in the second half of the cycle. The Tag RAM Bypass circuit 200 operates to bypass the input write data to the output line data out 214, the output read data, in place of the data that is acquired from the memory cell 208.

The Tag RAM Bypass circuit 200 responds to a high, rail-to-rail, digital signal on the bypass line 234 by entering a bypass mode of operation. Static write data signals are set up on the write data line 210 and the write data bar line 212 that activate either the n1 transistor 248 or the n2 transistor 252. If a read address and write address match, the bypass signal on the bypass line 234 also goes high so that a current path forms on either the true side of the sense amplifier 202 at node 240 or the complement side of the sense amplifier 202 at the node 238. The current generated by the small sized n-channel MOSFETs, the n1 transistor 248 and the n2 transistor 252, is much greater than the current generated by the 10 micron pass transistors, access transistors 218 and 220, because n1 and n2 transistors 248 and 252 are saturated, fully activated or turned on. Consequently, a larger voltage differential is generated by the transistor stacks 242 and 244 than is generated by the access transistors 218 and 220. As a result, the bypass signal selectively overrides any signal driven by the access transistors 218 and 220. If the access transistors 218 and 220 attempt to drive the Tag RAM Bypass circuit 200 plus-to-minus, the bypass signal can easily overwhelm the access transistors 218 and 220 and drive the Tag RAM Bypass circuit 200 minus-to-plus.

The delay that is incurred in the bypass operation occurs at the same time as the delay for accessing the tag RAM 104 so that speed performance of the circuit is substantially improved. Advantageously, because the transistor stacks 242 and 244 contribute extremely low capacitance to the nodes 238 and 240, the Tag RAM Bypass circuit 200 operates with essentially no access delay yet, because the transistor stacks 242 and 244 are fully-saturated and turned-on, the transistor stacks 242 and 244 supply a suitable signal into the sense amplifier 202. It is highly advantageous that the Tag RAM Bypass circuit 200 forwards data to the analog nodes 238 and 240 and performs a multiplexing function with effectively no delay.

Figure 4:
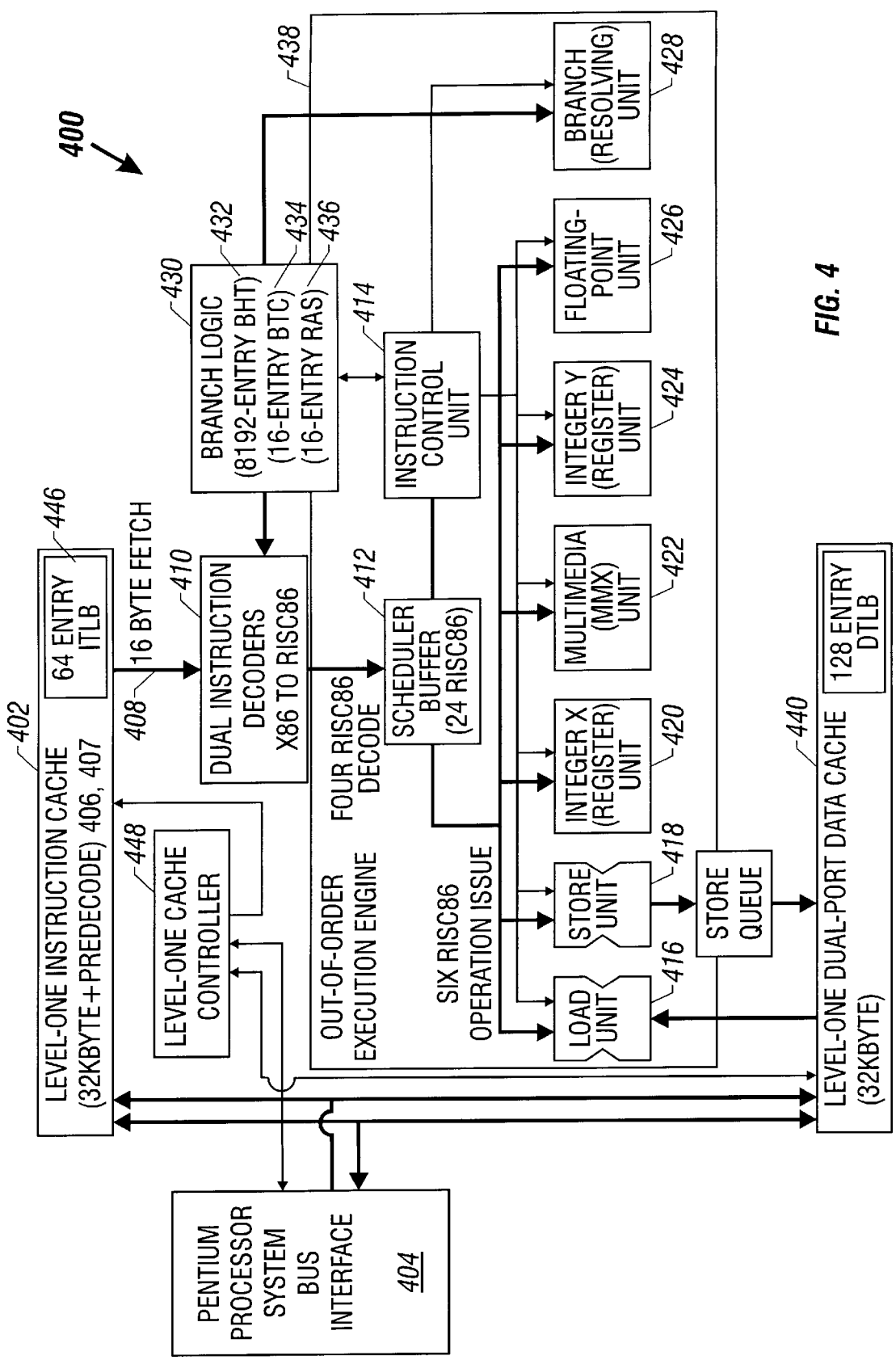
FIG. 4 is an architectural block diagram which illustrates an embodiment of a microprocessor in accordance with an embodiment of the present invention.

Referring to FIG. 4, a schematic block diagram illustrates an embodiment of an AMD-K6 microprocessor 400. The microprocessor 400 is an X86 instruction set-compatible microprocessor implementing a set of Multi-Media eXtenstions (MMX). A level-one (L1) instruction cache 402 begins predecoding instructions obtained from a processor system bus interface 404 during filling of the 32 KB two-way associative L1 instruction cache 402. The L1 instruction cache 402 includes a 64-entry instruction translational lookahead buffer (ITLB) 446. Bypass (not shown) and storage buffers (not shown) for instructions (4×16) and predecode (4×20) to the L1 instruction cache 402 are supplied to allow data-in and data flow-back to cache terminals.

A level-one cache controller 448 controls caching in the L1 instruction cache 402. The L1 instruction cache 402 uses a Most Recently Used (MRU) prediction technique to predict the way selection on cache accesses. A misprediction in the way selection results in a penalty of one cycle. The L1 instruction cache 402 line replacement algorithm is Least Recently Used (LRU) although an alternative random replacement algorithm is supported using an SR5.ICERLR configuration bit. The L1 instruction cache 402 also supports a direct-mapped replacement algorithm, reducing the cache size from 32 KB to 16 KB, using an SR5.ICDM configuration bit.

The L1 instruction cache 402 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 400 includes predecode logic 406 and a predecode cache 407 to identify instruction boundaries and fill the L1 instruction cache 402. Once the L1 instruction cache 402 is filled, predecode bits are stored in the 20 kB predecode cache 407. Predecode bits resolved during the predecoding operation are stored in a 20 KB predecode cache 407. Predecode logic 406 includes a first stage of instruction decode logic. Data from the L1 instruction cache 402 are fetched by fetch logic 408 and transferred to dual instruction decoders 410. The dual instruction decoders 410 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 410 are transferred to a RISC86 Op Scheduler and buffer 412. The RISC86 Op Scheduler 412 holds up to 24 RISC Ops and stores a total of 48 registers using register renaming. The Scheduler 412 contains logic to track instructions from decode to retirement, determining dependencies, scheduling execution, and committing architectural state. The Scheduler 412 is structured as a FIFO queue with instructions entering the queue four at one time to match the macroinstruction decoder bandwidth and up to four instructions retiring at one time at the end of the queue. Instructions enter the Scheduler 412 after decoding or fetching and remain in the scheduler queue until retirement. The Scheduler 412 queue is a general structure for usage for all categories of instructions and thus serves to hold instructions directed to different execution units. The Scheduler 412 utilizes implicit register renaming, which is based on position within the queue rather than explicit tag assignments, so that the Scheduler 412 avoids usage of full renaming hardware.

The Scheduler 412 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 412. The eight group terms are combined in a three-level tree to create a group carry in terms Cgrp[7:0]. The group carry terms Cgrp[7:0] are used within each group to select the operand source Op.

The RISC86 Op Scheduler 412, under control of an instruction control unit 414, issues up to six RISC86 Operations using out-of-order issuing to seven parallel execution units. The execution units speculatively execute the RISC86 Ops to generate results. The RISC86 Op Scheduler 412 retires the results in-order. The execution units include a load unit 416, a store unit 418, an integer X register unit 420, a Multi-Media eXtension (MMX) unit 422, an integer Y register unit 424, a floating-point unit (FPU) 426, and a branch resolving unit 428. A branch logic unit 430 implements a branch prediction operation that uses two-level branch prediction based on an 8192-entry Branch History Table (BHT) 432, a 16-entry Branch Target Cache (BTC) 434, and a 16-entry Return Address Stack (RAS) 436.

The dual instruction decoders 410 translate X86 instructions on-the-fly into corresponding RISC86 Ops. The RISC86 Ops are executed by an instruction core 438 that is essentially a RISC superscalar processing engine. The fetch logic 408 fetches up to sixteen instruction bytes each cycle from the L1 instruction cache 402 and transfers the instruction bytes into an instruction buffer (not shown) preceding the dual instruction decoders 410 so that the instruction buffer is maintained at capacity. The dual instruction decoders 410 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 412. The RISC86 Op Scheduler 412 controls and tracks multiple aspects of RISC86 Op issue and execution.

The microprocessor 400 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 412, functioning as a reorder buffer, commits the RISC86 Ops in-order to ensure precise exception handling and full operational compatability with X86 architecture standards. The RISC86 Op Scheduler 412 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 412 has a first-in-first-out (FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 416 loads data via a level-one (L1) dual-port data cache 440 which receives data from an external memory (not shown) via the processor system bus interface 404. Bypass (not shown) and storage buffers (not shown) for data (4×16) to the data cache 440 are supplied to allow data-in and data flow-back to cache terminals.

The data cache 440 includes a 128-entry data translational lookahead buffer (DTLB) 444. The data cache 440 is a 2-way set-associative, 32 KB size cache with a 64 byte line-size and 32-byte sub-blocking. The data cache 440 fills on the basis of the 32-byte sub-block units. In contrast to the L1 instruction cache 402, the data cache 440 uses a Least Recently Missed (LRM) selection technique which is generally a more accurate way selection scheme than the LRU technique of the L1 instruction cache 402. In the LRM scheme, the line that first enters the cache is replaced. An alternative random replacement algorithm is supported and activated through usage of a SR5.DCERLR configuration bit. The data cache 440 also supports a direct-mapped replacement algorithm, reducing the cache size from 32 KB to 16 KB, using an SR5.DCDM configuration bit.

The data cache 440 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookahead buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 440 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 418 transfers data to the data cache 440 through a store queue 442.

The MMX unit 422 is implemented to incorporate an X86 instruction subset called the Multi-Media eXtensions (MMX) thereby supporting a growing number of applications in the areas of communications and multimedia. The MMX unit 422 supports the new instructions and the new data types that are defined by the MMX standard to increase processor performance in the targeted applications. The MMX unit 422 executes a Single Instruction, Multiple Data (SIMD) technique to process multiple operands of 8, 16, or 32 bits in a 64-bit data path to perform highly parallel and computationally intensive algorithms that are typical for multimedia applications. The MMX unit 422 supports 57 new instructions that execute additions, subtractions, multiplies, multiply-accumulates, logical shifts, arithmetic shifts, and several other operations. Most operations are executed on operands of any data type.

Figure 5:
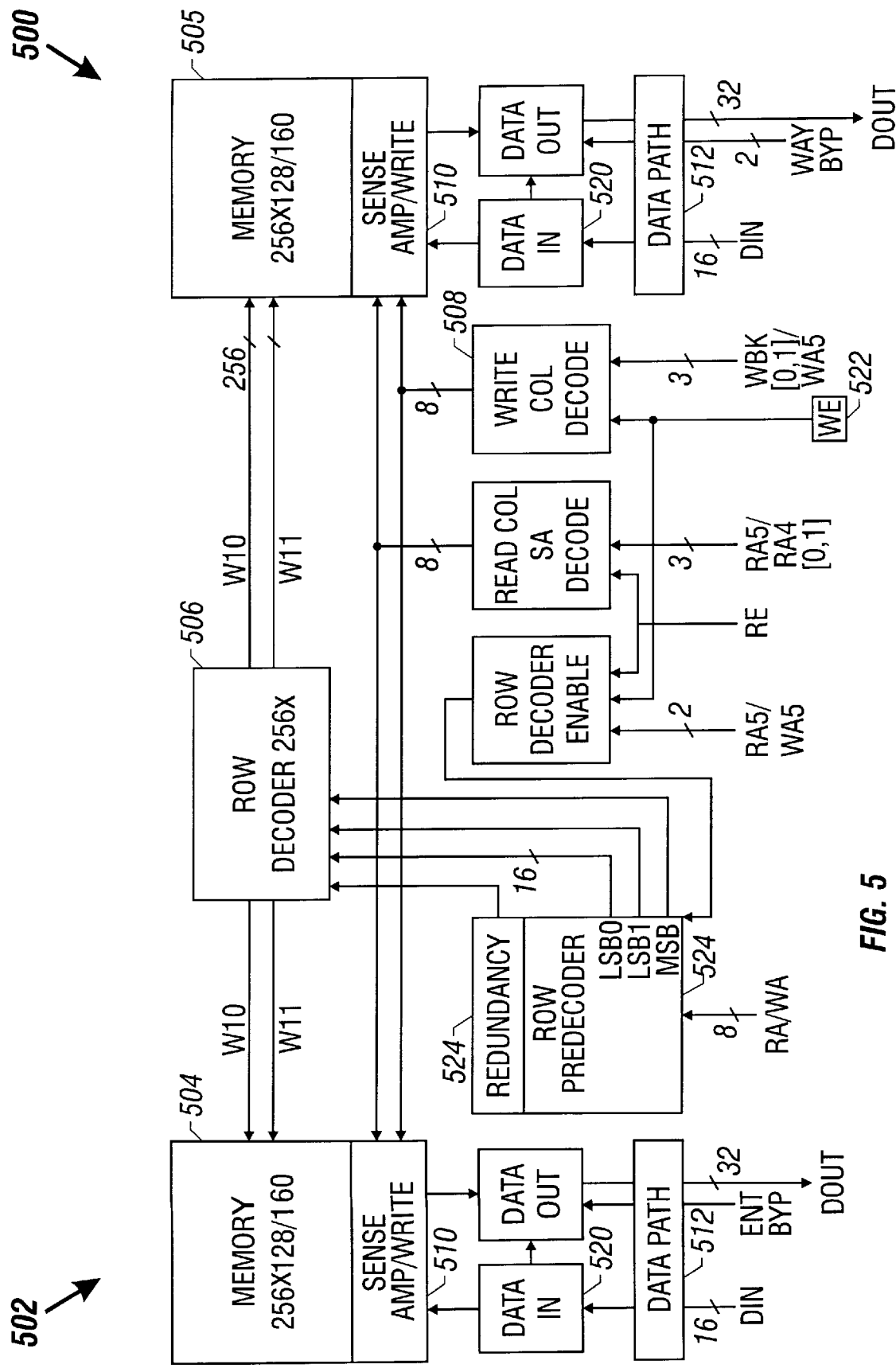
FIG. 5 is a schematic block diagram illustrating an embodiment of a cache which is suitable for usage as the data cache or the instruction cache shown in FIG. 4.

Referring to FIG. 5, a schematic block diagram shows an embodiment of a cache 500 which is suitable for usage as the L1 instruction cache 402 or the data cache 440 shown in FIG. 4, or the predecode cache (not shown). The microprocessor 400 has several level-one (L1) caches including the 32 kB L1 instruction cache 402, the 32 kB data cache 440, and the 20 kB predecode cache 406. The L1 instruction cache 402 and the data cache 440 are 32 kB, two-way set-associative caches with a 64 byte line size, 32 byte sub-blocking, and constructed in 8 kB blocks. The predecode cache is constructed in 10 kB blocks. The L1 instruction cache 402 and data cache 440 are filled on a sub-block basis, physically-tagged, and virtually-indexed with bits 13:6, where bits 13:12 are translated address bits. Synonyms and aliasing are handled in hardware. The L1 instruction cache 402 and data cache 440 maintain mutual exclusion to simplify handling of self-modifying code. A hit-under-miss capability is supported. Each of the L1 instruction cache 402 and the data cache 440 include 256 sets. Each set contains two ways (or lines) and each line contains two sub-blocks so supply a total storage of 256×2×64B=32 kB.

FIG. 5 depicts a cache block 502 having a size of 8 kB. The illustrative cache block 502 includes two cache arrays 504 and 505, each having 256 rows and 128 columns. The cache block 502 supports a byte write function. Row decode 506, column write decode 508, sense amplifier decode 510, and datapath 512 circuits utilize dynamic logic with keepers for delay improvement. The dynamic circuits are held static by weak keepers. While the decode 506, 508, and 510 and datapath 512 circuits are dynamic logic, data input circuits 520, bypass circuits (not shown), and storage buffers (not shown) are circuits constructed using conventional-type CMOS logic.

A write eviction buffer 522 has conventional-type memory cells to efficiently implement 4×256 storage locations using CMOS logic. Asynchronous input control signals are connected to the write eviction buffer 522 to access the four storage levels. Predecode expansion logic 524 is implemented in dual-rail, dynamic, non-clocked logic.

The cache block 502 uses time multiplexing to perform one read operation and one write operation per clock cycle using a read column select and column read decode 516 that are separate from a write column select and column write decode 518.

Predecode expansion logic (not shown) is implemented in dual-rail dynamic non-clocked logic. A scan functionality is implemented in sense amplifiers 514 to supply array bit-mapping and datapath logic testability. Testability is further enhanced by usage of separate array and word line power supplies (not shown) so that that retention is tested at the time of wafer sort in a manufacturing process to determine functionality of p-channel pull-up transistors (not shown) in the memory cells. Dual word-lines (not shown) are used in each row in combination with a one-of-two block select to reduce power consumption.

The row decode 506 drives word lines w1 to the two cache arrays 504 and 505 for both read and write operations. The row decode 506 includes flip-flops (not shown) and multiplexing (not shown) for write addresses and read addresses that is located after the flip-flops. The row decode 506 includes pairs of word line drivers per memory cell pitch and decoded by the least significant column decode bit so that either or both word lines are selectively activated dependent on wrap-around between upper or lower cache line words. The paired word line structure advantageously reduces power consumption.

The L1 instruction cache 402 and the data cache 440 have physical tags, handle synonyms and aliasing in hardware, support hit under miss, and maintain mutual exclusion to assist the handling of self-modifying code.

Figure 6:
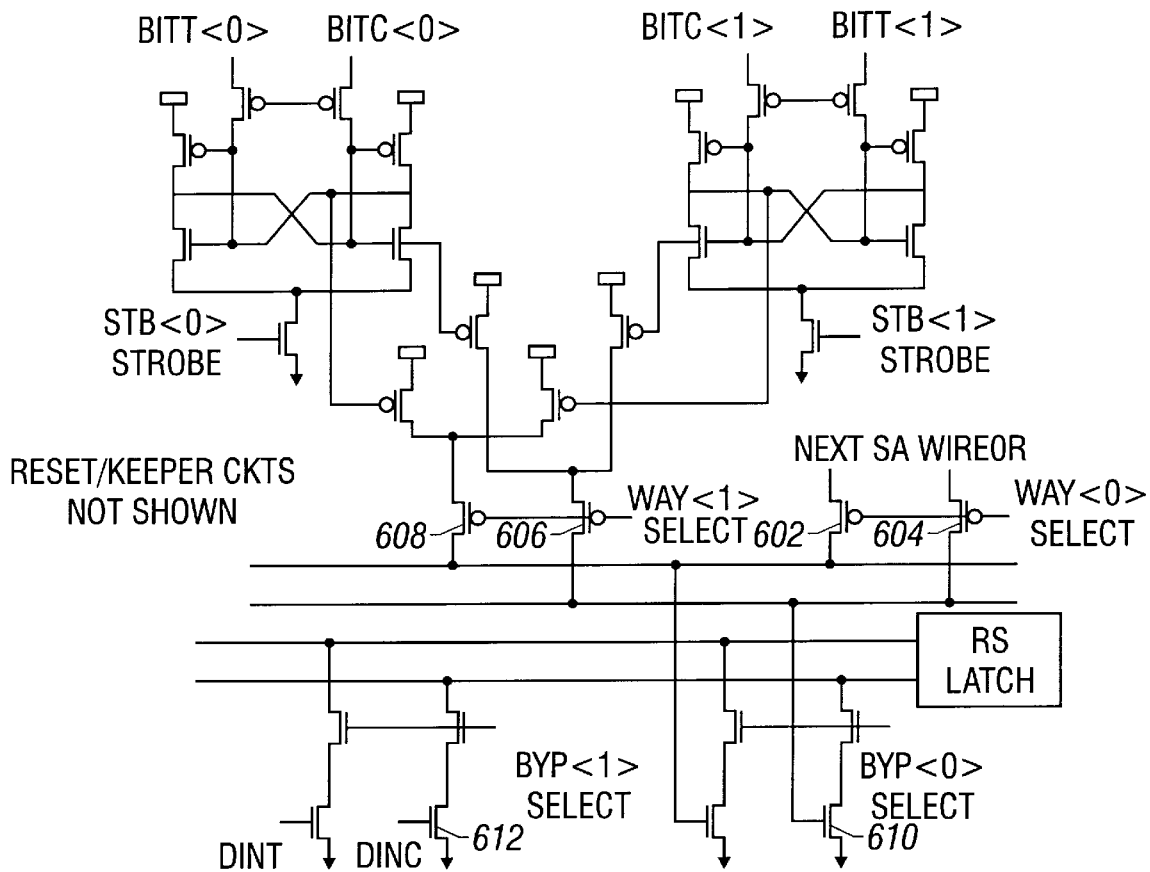
FIG. 6 is a schematic circuit diagram that illustrates an embodiment of the sense amplifiers 514 shown in FIG. 5.

Referring to FIG. 6, a schematic circuit diagram illustrates an embodiment of the sense amplifiers 514 shown in FIG. 5. The sense amplifiers 514 utilize a one per column pitch regenerative sense amplifier architecture that permits late selection by the column decode and way select after cache sensing is toleranced for offsets. Sense amplifier select signals are decoded and the decoded signals are wire-ORed for column selection by transistors 602 and 604 for way<0>and by transistors 606 and 608 for way <1>. Bypass select signals are applied for controlling the sense amplifier 514. The way select and bypass select signals are applied to the sense amplifier 514 in a two-level cascade of two input multiplexers 610 and 612. The wire-OR transistors 602, 604, 606, and 608, the two input multiplexers 310 and 312, and an output driver 314 are dynamic logic circuits to improve delay performance. Drivers (not shown) that increase the signal gain to a wide set (64x) of two-input way select multiplexers are also dynamic logic circuits.

A scan of the sense amplifiers 514 supports readout of data in the cache arrays 504 and 505 for bitmap and debug analysis.

Figure 7:
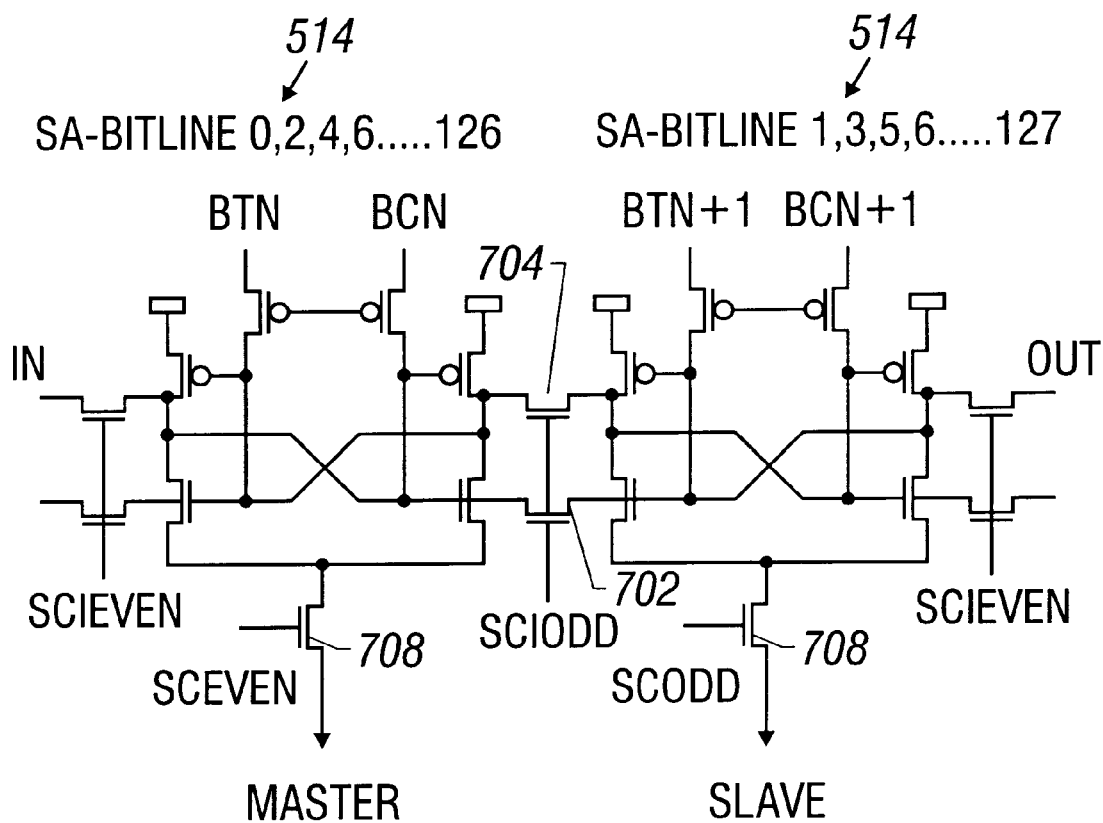
FIG. 7 is a schematic circuit diagram showing an interconnection between sense amplifiers.

Referring to FIG. 7, a simplified schematic circuit diagram shows an interconnection between sense amplifiers 514, indicating pairing of the sense amplifiers 514 in master/slave combinations. A pair of NMOS transfer gates 702 and 704 are added to column-pitched circuits between adjacent sense amplifiers 514. Auxiliary control circuits (not shown) activate sense amplifier strobes 706 in odd-even combinations to serially shift data through the chain of connected sense amplifiers 514. The NMOS transfer gates 702 and 704 are also alternately activated by transistors 708 controlled using two-phase scan clocking. A first two-phase scan clock positive transition recirculates input flip-flop data from a previous read operation accessing the memory array from a last address.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A circuit comprising:
a node coupled to a high-capacitance driver for driving a terminal;
a high capacitance read select switch coupling a storage element to the node;
a low capacitance bypass switch coupling a write data source to the node, the write data being passed to the node and driven to the terminal bypassing the read data from the storage element while incurring no read access timing penalty.

2. A circuit according to claim 1, further comprising:
a sense amplifier including a high capacitance device coupled to the node.

3. A circuit according to claim 1, further comprising:
a timing control circuit coupled to the write data source and coupled to the read select switch, the timing control circuit for timing a full cycle including a first half cycle and a second half cycle, applying write data at the beginning of the first half cycle and passing the write data to the terminal, bypassing the read data from the memory element that is read during the first half cycle.

4. A circuit according to claim 1, further comprising:
a low capacitance write data switch coupled to the low capacitance bypass switch.

5. A circuit according to claim 1, wherein:
the low capacitance bypass switch operates in saturation.

6. A circuit according to claim 1, wherein:
the node includes a true node and a complementary node;
the high capacitance read select switch includes a pair of p-channel MOSFETs having source-drain pathways coupled respectively from a bit line to the true node and from a bit line bar to the complementary node;
the storage element is coupled between the bit line and the bit line bar;
the low capacitance bypass switch includes a pair of n-channel MOSFETs having source drain pathways coupled respectively between the true node and a reference and between the complementary node and the reference.

7. A circuit according to claim 6, further comprising:
a sense amplifier including a pair of cross-coupled devices coupled respectively to the true node and to the complementary node.

8. A method comprising:
supplying data from a first data source to an node;
switching a data path from the first data source to the node using a relatively large capacitance switch;
supplying data from a second data source to the node; and
switching a data path from the second data source to the node using a relatively small capacitance switch operating in saturation.

9. A method according to claim 8 further comprising:
bypassing the data from the second data source in preference over the data from the first data source by virtue of the relatively small capacitance of the relatively small capacitance switch operating in saturation.

10. A processor comprising:
an execution engine;
an instruction decoder coupled to the execution engine, the instruction decoder decoding instructions and supplying operations to the execution engine for execution;
a cache coupled to the instruction decoder, the cache supplying instructions to the instruction decoder for decoding into operations, the cache including a circuit including:

an node coupled to a high-capacitance driver driver for driving a terminal;

a high capacitance read select switch coupling a storage element to the node;

a low capacitance bypass switch coupling a write data source to the node, the write data being passed to the node and driven to the terminal bypassing the read data from the storage element while incurring no read access timing penalty.

11. A processor according to claim 10, the circuit further comprising:

a sense amplifier including a high capacitance device coupled to the node.

12. A processor according to claim 10, the circuit further comprising:

a timing control circuit coupled to the write data source and coupled to the read select switch, the timing control circuit for timing a full cycle including a first half cycle and a second half cycle, applying write data at the beginning of the first half cycle and passing the write data to the terminal, bypassing the read data from the memory element that is read during the first half cycle.

13. A processor according to claim 10, the circuit further comprising:

a low capacitance write data switch coupled to the low capacitance bypass switch.

14. A processor according to claim 10, wherein:

the low capacitance bypass switch operates in saturation.

15. A processor according to claim 10, wherein:

the node includes a true node and a complementary node;

the high capacitance read select switch includes a pair of p-channel MOSFETs having source-drain pathways coupled respectively from a bit line to the true node and from a bit line bar to the complementary node;

the storage element is coupled between the bit line and the bit line bar;

the low capacitance bypass switch includes a pair of n-channel MOSFETs having source drain pathways coupled respectively between the true node and a reference and between the complementary node and the reference.

16. A processor according to claim 15, wherein the circuit further comprises:

a sense amplifier including a pair of cross-coupled devices coupled respectively to the true node and to the complementary node.

\* \* \* \* \*

UNITED STATES PATENT AND TRADEMARK OFFICE
CERTIFICATE OF CORRECTION

PATENT NO. : 5,940,334
ISSUE DATE : August 17, 1999
INVENTOR(S) : Holst, John C.

It is certified that error appears in the above-identified patent and that said Letters Patent is hereby corrected as shown below:

Column 7, lines 9-10; please delete "lookahead" and insert --lookaside--;
Column 8, line 60; please delete "compatability" and insert --compatibility--;
Column 9, line 15; please delete "lookahead" and insert --lookaside--; and
Column 9, line 40; please delete "lookahead" and insert --lookaside--.

Signed and Sealed this

Tenth Day of April, 2001

Attest:

NICHOLAS P. GODICI

Attesting Officer      Acting Director of the United States Patent and Trademark Office